United States Patent
Fulton

[11] Patent Number: 5,946,185
[45] Date of Patent: Aug. 31, 1999

[54] ACTIVE ELECTROLYTIC SEMICONDUCTOR DEVICE

[76] Inventor: James Thomas Fulton, 1106 Sandpiper Dr., Corona Del Mar, Calif. 92625-1407

[21] Appl. No.: 08/961,434

[22] Filed: Oct. 30, 1997

[51] Int. Cl.[6] .................................................. H01G 9/00
[52] U.S. Cl. ............................................ 361/512; 361/434
[58] Field of Search ................................. 361/434, 500, 361/502, 503, 512, 523, 525; 252/62.2, 299.01

[56] References Cited

U.S. PATENT DOCUMENTS

| | | | |
|---|---|---|---|
| 2,524,035 | 10/1950 | Barden et al. | 330/250 |
| 2,685,025 | 7/1954 | Root, III | 361/507 |
| 3,051,876 | 8/1962 | Bardeen | 361/434 |
| 3,701,930 | 10/1972 | Tami | 361/500 |
| 4,332,003 | 5/1982 | Hetrick | 361/434 |
| 4,435,742 | 3/1984 | Hetrick | 361/434 |

OTHER PUBLICATIONS

Cell Membrane Transport Kotyk, A & Janecek, K Plenum Press pp. 299–304, 1954.
Electrolytk Analog Transistor J. Appl. Physics vol. 25 #5 pp. 600–606.

*Primary Examiner*—Kristine Kincaid
*Assistant Examiner*—Anthony Dinkins

[57] ABSTRACT

An active liquid-state three terminal semiconductor device employing thermodynamically reversible processes and capable of being combined with other thermodynamically reversible and reactive circuit elements leading to electrical signal amplification in circuits with negligible electrical power consumption but also capable of being interfaced efficiently to conventional thermodynamically irreversible circuit elements in many bionic applications.

4 Claims, 3 Drawing Sheets

ACTIVE ELECTROLYTIC SEMICONDUCTOR DEVICE

BACKGROUND AND OBJECTS OF THE INVENTION

1. Background-Field of Invention

This invention relates to an active liquid-state three terminal semiconductor device of the bipolar type formed from electrolytic diode elements.

2. Background-Description of Prior Art

Theory

1. General

With the wide spread development of solid state semiconductor devices has come a broader understanding of there underlying principle of its operation. This principle has come to be known as "transistor action". Transistor action has been achieved in both unipolar and bipolar semiconductor materials. It is now recognized that a bipolar device capable of amplification can be created by merging two diode structures in such a way that their two cathode regions are in intimate proximity. Under these conditions, any charge introduced into the region between the two cathodes will be subject to a localized combination of an electrical field potential and a chemical diffusion potential. These localized potentials are essentially independent of the overall potential of the common cathode relative to the two anodes. If one of these diode structures is forward biased (i. e. having an external electrical potential applied across the diode of such a polarity as to encourage the flow of charges through the diode), the other structure is reverse biased (i. e. having an external electrical potential applied across the diode of such a polarity as to discourage the flow of charges through the diode), and charges are injected into the resulting region of opposed electrical and diffusion fields through the forward biased diode, an essentially equal number of charges will appear at the anode of the reverse biased diode. Although the two charges are essentially equal, the charge at the anode is usually described as $Q_{out}=\alpha*Q_{in}$, where $\alpha$ is approximately 0.96. The charge appearing in the common cathode lead is equal to $Q_{in}-Q_{out}=0.04*Q_{in}$. The ratio of the output current to the common cathode current is then given by $M=\alpha*Q_{in}/Q_{in}-Q_{out}=24$. Although the input charge and the output charge are essentially equal, the impedance level at the anode of the forward biased diode (known as the emitter) is considerably smaller than the impedance level of the anode of the reverse biased diode (known as the collector). Because of this impedance difference, the device can exhibit considerable voltage amplification expressed as the ratio of the change in voltage at the collector divided by the change in voltage at the emitter.

This disclosure teaches that transistor action can be achieved in a variety of ways as long as the above relationship between two diodes is achieved. It is not necessary that solid state materials be used to achieve transistor action.

2. Thermodynamics

Electrical devices can described, based on the most basic thermodynamic principles, as involving either reversible or irreversible processes. Most common electrical devices are based on irreversible thermodynamic principles in that they employ one or more energy dissipating elements.

The subject of this invention is based on reversible thermodynamic principles and does not dissipate significant energy in the form of heat in its normal operation. The subject of this invention can be incorporated into circuits utilizing only reversible thermodynamic principles. In such an implementation, negligible energy is dissipated in the form of heat during the operation of the overall circuit. Hybrid circuit implementations are also possible which minimize but do not eliminate the dissipation of energy.

3. Categories

Active semiconductor devices can be divided into 5 categories based on the types of charges involved and the type of bulk material used to conduct those charges;

1. Charges (electrons) moving in metals
2. Charges (holes and electrons) moving in semi-metallic materials (commonly called semiconductors)
3. Charges (holes and electrons) moving in semi-liquid materials
4. Charges (positive and negative ions) in liquids
5. Charges (positive or negative ions) in gases It is a teaching of this disclosure that transistor action can be achieved by creating intimate diode pairs out of any combination of the above categories of charge and material, including the situation where one material is used in two forms—one form where the majority charges are electrons (n-type material) and one form where the majority charges are holes (p-type material). The underlying requirement is that two opposing potential fields be created, an electrical potential field and a diffusion potential field between two electrical terminals, each of which terminals constitutes the cathode of a diode.

4. Classes

The Patent Office appears to divide the above categories into two classes; Class 257 for active solid state devices, limited to solid (as opposed to liquid), gas or vacuum materials for category 1, 2 and 5 and residual Class 361 for electrolytic systems and devices, Subclass 500+ wherein the conduction of electricity is accompanied by chemical action for category 3 and 4.

It is a teaching of this disclosure that an active semiconductor device can be realized using a liquid-state implementation operating in a thermodynamically reversible environment that is more effective than previous devices relying on solid state implementations.

5. Interconnection

It is well known in the art that the electrical transition between devices employing different types of charge carriers is complex. In going from a metallic circuit wherein electrons are the dominant charge carrier to a semiconductor where holes are the dominant charge carrier, a mechanism must frequently be employed to facilitate the transition. Similarly in the case of transitions between metal circuits and electrolytic circuits. This transition may be a low impedance bi-directional one or a rectifying one wherein the impedance in one direction is very high and the impedance in the opposite direction is very low. Each of these transitions usually involves a potential difference as well. Thus, the typical transition between any of the above categories involves a potential difference and an impedance in series, the pair shunted by a capacitance; the impedance exhibiting a characteristic that may vary from a very low bi-directional resistance to a diode. In most metallic and semiconductor situations, any resistance term associated with the interface is usually of the heat dissipative type and the process is irreversible. In the case of many electrolytic situations, any impedance related to the interface involves a reversible electrochemical process. This type of resistance involves a thermodynamically reversible process. This is a fundamental difference between metallic and electrolytic based electrical circuits that is very important. It is so important that it is necessary to indicate in a complex circuit with an interface between media which resistances are of the dissipative type and which are reversible. This is so important that the reversible resistances should be indicated using a different notation, such as using the last letter in the Cyrillic alphabet, Я, pronounced yau, to replace R. In transitions between metallic and electrolytic circuits, the interface exhibiting a low bi-directional resistance is known as a non-polarizable electrode; the interface exhibiting a diode characteristic is known as a polarizable electrode.

6. Separator Systems

It is well known in the art that a system consisting of a semipermeable separator placed between two electrolytes will exhibit a potential between the two electrolytes under equilibrium conditions, and also, under steady state conditions. If an external circuit, which includes a variable voltage source, is completed between these two electrolytes, the current-voltage characteristic of the above system can be determined under non-equilibrium conditions. This characteristic usually has the shape of a diode, i.e., the graph of the characteristic is that of an exponential function. If the voltage source is varied rapidly, the current flowing through the circuit will also indicate the presence of a capacitive impedance. Such a separator elctrolyte system can be characterized by an equivalent circuit consisting of a voltage source in series with an impedance, which is typically a diode, the combination shunted by a capacitance. In such an electrolytic system, the intrinsic voltage is due to the electrochemical action of the semipermeable separator establishing a higher concentration of the various ions on one side of the separator relative to the other side. The intrinsic impedance is representative of the ease with which the above concentration difference is increased or decreased; and it is normally asymmetrical as in the case of a diode. The unique property of this impedance is that it is not related to the thermodynamic dissipation of heat; it represents a reversible thermodynamic process since the change in the concentration differential will generate a current in the process of returning to the original equilibrium condition.

It must be kept in mind that many electrolytes have relatively low bulk conductivity. It is therefore quite likely that a electrolyte-separator system may exhibit a resistance term due to the bulk conductivity of the materials involved This is normally a dissipative resistance and therefore a irreversible resistance. It is important to maintain a clear distinction between the dissipative and non-dissipative resistances in an electrolytic system.

Separators as envisioned here can be created in a variety of ways. They may be entirely man made, of animal or plant origin, or a mixture of both. Kotyk & Janacek describe some of the ways to produce organic separators in Chapter 14 of their book, "Cell Membrane Transport". Separators are usually heterogeneous and may involve identifiable surface coatings, especially if the separator is being used in a system where different types of charge carriers are found on the opposite sides of the separator.

7. Conclusion

As indicated above, there are many processes involved in electrolytic, or electro-chemical circuits that are significantly different from conventional electro-physical circuits involving metallic conductors. Most of these processes involve thermodynamically reversible events as long as the necessary chemical constituents are present to sustain the processes. The utilization of such reversible processes in a practical device and in practical systems based on this device is a principle goal of this invention.

Because of the breadth of the above theory, the above discussion is meant to be illustrative and I don't wish to be bound by it.

Other Art

In order to provide background information so that the liquid-state three terminal semiconductor device may be completely understood and appreciated in its proper context, reference is made to a number of prior art patents and publications as follows:

U.S. Pat. No. 2,524,035, Bardeen & Brattain, of Oct. 3, 1950, shows a superficial similarity to this invention. It would fall in Class 257 if filed today. Bardeen & Brattain defined a 3 electrode bipolar device based on a combination of metallic and semi-metallic materials and never mentioned the word liquid (or aqueous) or semi-liquid (or liquid crystalline or gel). Their device provided a major part of the foundation of the field which is now known as active solid state devices. It employed diodes formed using materials from the first two categories mentioned above. Subsequently, the U. S. Patent Office has defined a solid state device as one employing solid (as opposed to liquid), gas or vacuum materials. Each of the claims in Bardeen & Brattain call for the use of a block or body of semiconductive material; clearly calling for the use of a solid material.

Bardeen & Brattain only envisioned junctions between metallic and semi-metallic materials resulting in a rectifying contact.

Bardeen & Brattain either described or assumed free electrons moving in the metallic material of the junction and electrons and holes moving in the semi-metallic material of the junction. They did not contemplate or discuss positive and/or negative ions moving in the liquid material of the junction and/or electrons and holes moving in the semi-liquid material of the junction.

Bardeen & Brattain employed conventional heat dissipating resistors in the associated circuitry of their invention, typically labeled $R_L$(R sub L) in their figures.

U.S. Pat. No. 2,685,025, Root, of Jul. 27, 1954, defines a device with a single reservoir containing a single electrolyte made up of both ionic and free iodine in solution; and with a significant distance between the active electrodes. The inventor describes the "control of the output current is effected through the agency of controlling the supply of depolarizer." The approach appears to be that of a controlled variable resistor. No claim is made that "transistor action" is achieved or utilized.

U.S. Pat. No. 3,051,876, Bardeen, of Aug. 28, 1962, defines a device meant to be an analog of the Bardeen and Brattain patent sited above. Both of the allowed claims involve a system that utilizes a conventional solid state transistor in conjunction with an electrolytic device containing only one reservoir for the electrolyte.

U.S. Pat. No. 3,701,930, Tami, of Oct. 31, 1972, defines a single reservoir of electrolyte and the claims call for "three electrically conductive electrodes which are spaced from each other", with a film on the surface of two of the electrodes. The film does form a rectifying or polarized contact with the electrolyte; however there is no intimation that the two film coated electrodes must be in intimate contact with each other or that a diode is created for purposes of transistor action.

U.S. Pat. No. 4,332,003, Hetrick, of May 25, 1982, has a title which would imply similarity to this invention except for the implication of space between the two electrolytic cells. The one primary claim and all derivative claims in that patent call for a "solid ionically conducting material" to act as the electrolyte.

U.S. Pat. No. 4,435,742, Hetrick, of Mar. 6, 1984, which is a continuation of U.S. Pat. No. 4,332,003, also has a title which would imply a space between the two electrolytic cells. In this patent, the second and all later claims call for the use of sulfuric acid as the electrolyte. The first claim calls for "said base region being an enclosed region which can take up the electrically active species in neutral form." The detailed description in column 6 lines 53–66 does not demonstrate that a device having two characteristics similar to a transistor is in fact a transistor and exhibits transistor action. Furthermore, the criteria that the collector current does not exceed the emitter current is not a criteria for achieving "transistor action", this criteria is met by any rheostat where the output current is necessarily less than the input current. It appears that this invention operates as a rheostat.

The title of both of the Hetrick patents calls for a space between the two electrolytic cells and both descriptions call for a neutral form of the active species in the space between the two cells.

With the exception of the solid state device of Bardeen & Brattain, none of the above inventions appears to operate in the active regime of the output current versus output voltage characteristic of the device required to achieve "transistor action" as discussed herein. The Bardeen & Brattain device is clearly an active solid state semiconductor device as opposed to an active liquid-state semiconductor device which is the subject of this invention.

Whatever the precise merits, features and advantages of the above cited references, none of them achieves or fulfills the purposes of the present invention.

Additional Theory

The liquid-state three terminal semiconductor device is usually implemented utilizing electrolytic and liquid crystalline materials which can be very similar to the organic materials of animals. This feature greatly simplifies the incorporation of this device into circuits that can be joined to the nervous and muscular tissue of animals without insult to the animal or long term damage to the man-made circuits.

Through the use of techniques well known in the art, it is also possible to combine the subject of this invention with both metallic and semi-metallic circuit elements.

The subject of this invention can be used to form an effective bridge between man-made circuit elements and natural circuit elements found in animals.

OBJECTS AND ADVANTAGES

Accordingly, several objects and advantages of the present invention are:

(a) to provide a device exhibiting similar functional properties to some active solid state devices but which can be made from carbon chemistry based materials in an electrolytic environment.

(b) to provide a device exhibiting broader functional properties than similar active solid state devices because of the unique properties and characteristics of the electrolytic process.

(c) to provide an active amplifying device which can be employed to create both small and large scale electronic circuit arrays which do not involve or require the dissipation of energy as heat in their operation (d) to provide an active amplifying device which is compatible with and easily interfaced with living animal tissue of both neural and muscular types.

(e) to provide a device which can be more effectively integrated into prosthetic devices designed to interface with living animal tissue.

(f) to teach about a new class of active liquid-state device.

(g) to teach about a new form of circuitry that is conceptually free of energy dissipating elements.

Further objects and advantages of my invention will become apparent from a consideration of the drawings and ensuing description.

Figure 1:
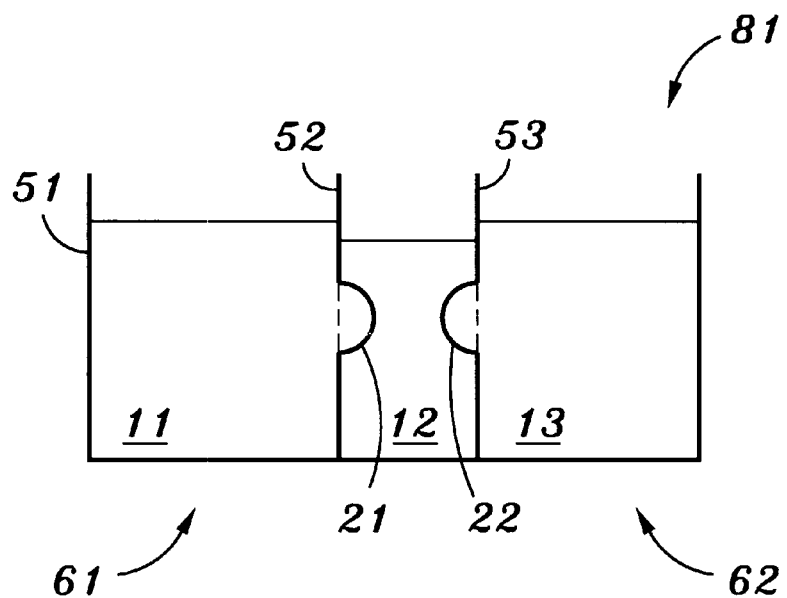
FIG. 1 is a cross section of a preferred embodiment of an active liquid based electrolytic semiconductor device without any associated circuits.

| LIST OF REFERENCE NUMERALS IN DRAWINGS | |
|---|---|
| 11 | first electrolyte |
| 12 | second electrolyte |
| 13 | third electrolyte |
| 14 | fourth electrolyte |
| 15 | fifth electrolyte |
| 16 | sixth electrolyte |
| 21 | first semipermeable separator |
| 22 | second semipermeable separator |
| 23 | third semipermeable separator |
| 24 | fourth semipermeable separator |
| 25 | fifth semipermeable separator |
| 26 | sixth semipermeable separator |
| 27 | seventh semipermeable separator |
| 28 | eighth semipermeable separator |
| 29 | ninth semipermeable separator |
| 34 | first electrode |
| 35 | second electrode |
| 36 | third electrode |
| 37 | fourth electrode |
| 44 | concentration gradient |
| 45 | voltage gradient |
| 47 | current generator |
| 48 | overall circuit |

-continued

LIST OF REFERENCE NUMERALS IN DRAWINGS

| | |
|---|---|
| 49 | electrical description |
| 51 | inert container |
| 52 | first partition with aperture |
| 53 | second partition with aperture |
| 54 | second inert container with three apertures |
| 55 | third inert container with five apertures |
| 56 | third partition with aperture |
| 57 | fourth partition with aperture |
| 61 | first separator system |
| 62 | second separator system |
| 63 | third separator system |
| 64 | fourth separator system |
| 65 | fifth separator system |
| 66 | sixth separator system |
| 67 | seventh separator system |
| 68 | eighth separator system |
| 69 | ninth separator system |
| 71 | first terminal |
| 72 | second terminal |
| 73 | third terminal |
| 74 | fourth terminal |
| 75 | fifth terminal |
| 81 | preferred embodiment |
| 83 | broader scope physical embodiment |
| 84 | still broader scope physical embodiment |
| 86 | first simple electrical network |
| 87 | second simple electrical network |
| 101 | first diode |
| 102 | second diode |
| 111 | first battery |
| 112 | second battery |
| 113 | first external battery |
| 114 | second external battery |
| 116 | quantum-mechanical force |
| 121 | first capacitor |
| 122 | second capacitor |
| 133 | first external impedance |
| 134 | second external impedance |

SUMMARY

In accordance with the present invention an active liquid-state three terminal electrolytic semiconductor device exhibiting transistor action upon the application of the proper voltages to the electrodes.

DETAILED DESCRIPTION OF PREFERRED EMBODIMENT INCLUDING CLAIMS

Physical & Electrical Description

FIG. 1 illustrates a preferred embodiment of the present invention. An open or closed inert container 51 is separated into three sections by a first partition with aperture 52 and a second partition with aperture 53. The aperture in partition 52 is typically 2 microns in diameter and is covered by a first semipermeable separator 21. The aperture in partition 53 is typically 2 microns in diameter and is covered by a second semipermeable separator 22. The three sections so formed are occupied by a first electrolyte 11, a second electrolyte 12, and a third electrolyte 13.

There is a conventional common negative ion (not shown) present in electrolyte 11, electrolyte 12 and electrolyte 13.

Separator 21, electrolyte 11 and electrolyte 12 form a first separator system 61. Separator 21 is electrically asymmetric and semipermeable to the electrolytes on each side of it. Separator 21 is oriented such that electrolyte 11 is electrically negative with respect to electrolyte 12.

The separator 22, electrolyte 12 and electrolyte 13 form a second separator system 62. Separator 22 is electrically asymmetric and semipermeable to the electrolytes on each side of it. Separator 22 is oriented such that electrolyte 13 is electrically negative with respect to electrolyte 12.

Figure 2:
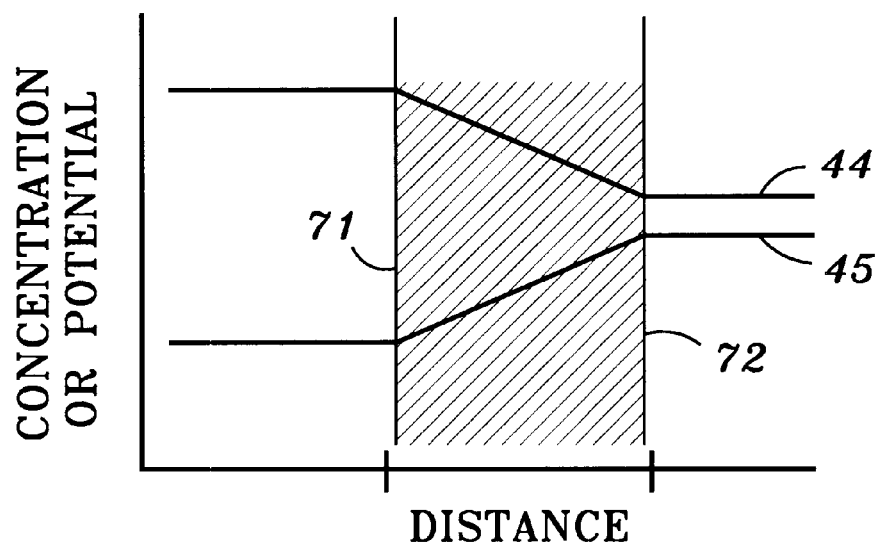
FIG. 2 is an illustration of the concentration gradients and potential gradients in a simple electrolytic separator system consisting of a semipermeable separator and the electrolytes on each side of the separator.

FIG. 2 illustrates the chemical and electrical environment relating to separator system 61. A concentration gradient 44 is shown for the conventional common negative ion (not shown) in the vicinity of and in a plane perpendicular to the surface of separator 21. A potential gradient 45 is also shown in the vicinity of and perpendicular to the surface of separator 21 to which the conventional common ion (not shown) is subject. A first terminal 71 is associated with the boundary between electrolyte 11 and separator 21. A second terminal 72 is associated with the boundary between electrolyte 12 and separator 21.

By adjusting the physical position of partition 52 and partition 53, or by other conventional methods, the surface of separator 21 facing electrolyte 12 is brought to within a predetermined distance, typically 20 Angstrom, of the surface of separator 22 facing electrolyte 12.

Figure 3:
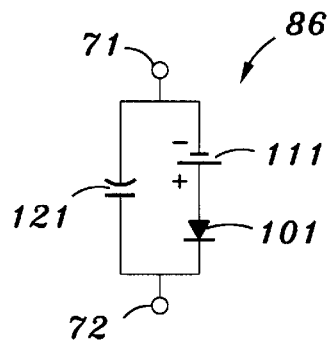
FIG. 3 illustrates the simple electrical circuit that describes the electrical properties of a simple electrolytic separator system.

FIG. 3 illustrates a first simple electrical network 86 describing separator system 61 comprised of terminal 72, a first diode 101 in series with a first battery 111 and terminal 71; with first capacitance 121 also connected to terminal 72 and terminal 71. The polarity of battery 1 11 is such as to encourage current to flow through first diode 101 if an external conductive circuit is provided between terminal 71 and terminal 72.

Figure 4:
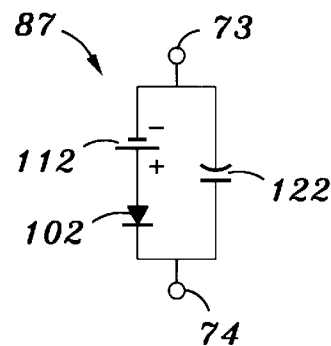
FIG. 4 illustrates a second simple electrical circuit that describes the electrical properties of a simple electrolytic separator system and is a mirror image of FIG. 3.

FIG. 4 illustrates a second simple electrical network 87 describing separator system 62 comprised of a third terminal 73, a second diode 102 in series with a second battery 112 and a fourth terminal 74; with a second capacitance 122 also connected between terminal 73 and terminal 74. The polarity of battery 112 is such as to encourage current to flow through second diode 101 if an external conductive circuit is provided between terminal 73 and terminal 74.

When separator system 61 is brought into juxtaposition with separator system 62 as described above, an electrical continuum is formed between the two juxtaposed separator systems. Under these conditions, terminal 72 and terminal 74 are electrically merged and diode 101 and diode 102 share a common cathode region. These conditions mediate what is known in the art as transistor action. Transistor action is realized if proper voltages are established between first electrolyte 11, second electrolyte 12 and third electrolyte 13. Transistor action is described electrically by the appearance of a current generator 47.

Figure 5:
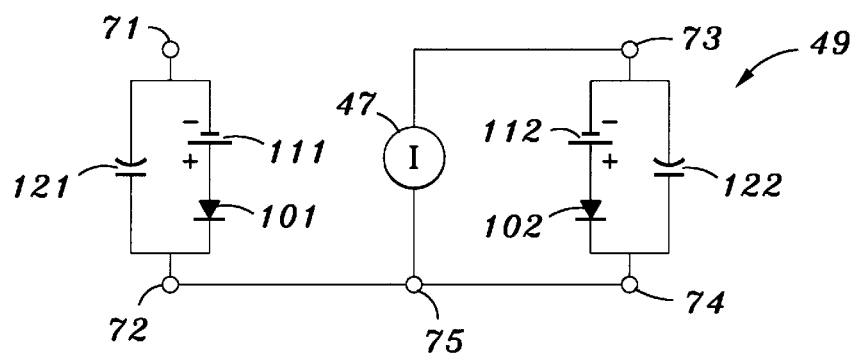
FIG. 5 illustrates the equivalent electrical network created by the proper positioning of the two separators while they are in contact with their respective electrolytes.

FIG. 5 illustrates the unique electrical characteristic achieved through this process where the generator 47 appears connected between terminal 73 and terminal 74, but is conventionally drawn in the related solid state semiconductor device art as though the generator 47 was connected between terminal 73 and a fifth terminal 75 which is in turn connected to the merged terminal 72 and terminal 74. The three terminals 72, 74 and 75 are in fact physically and electrically merged and cannot be disconnected from each other or contacted independently by any other circuit element.

All of the elements shown in FIG. 1 taken as a group, constitute the preferred embodiment 81 of the present invention. All of the elements shown in FIG. 5 taken as a group constitute a electrical description 49 of the preferred embodiment 81 utilizing conventional electrical symbols.

Figure 6:
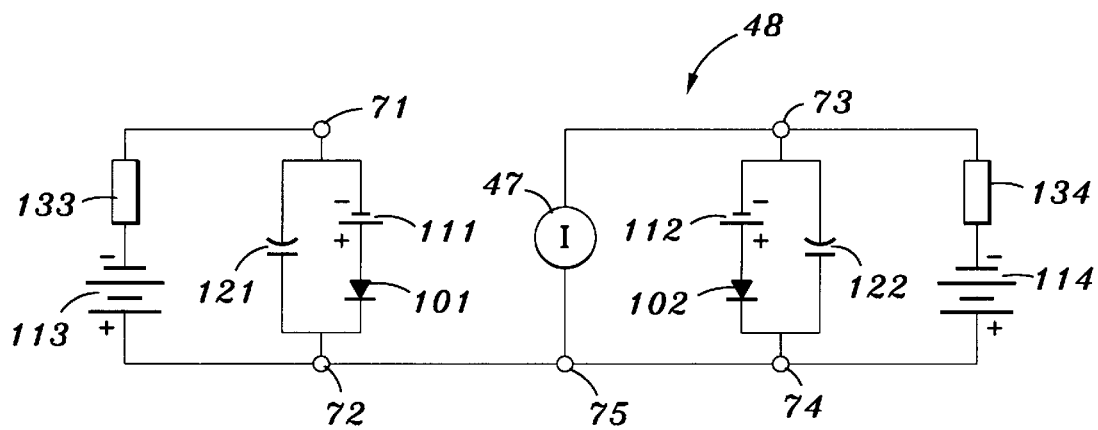
FIG. 6 illustrates the electrical description of the embodiment of FIG. 1 combined with additional elements required for overall operation of the device.

FIG. 6 illustrates a overall circuit 48 which includes the electrical description 49 of the preferred embodiment 81. It also includes a First external battery 113, a first external impedance 133, a second external battery 114, and a second external impedance 134 connected as shown.

Figure 7:
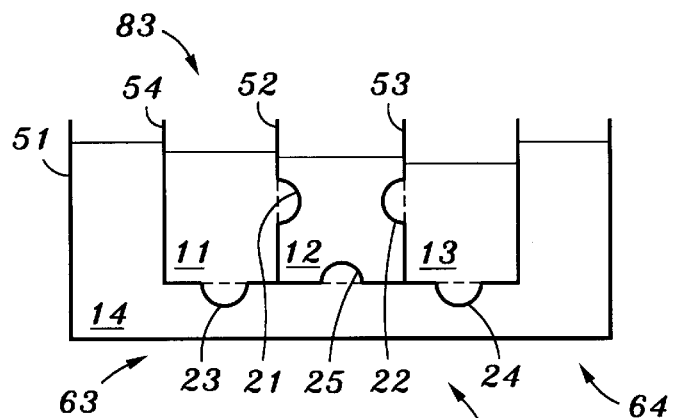
FIG. 7 illustrates a physical embodiment of an overall electrical circuit incorporating the embodiment of FIG. 1 and utilizing additional electrolytic circuit elements.

FIG. 7 illustrates a broader scope physical embodiment 83 or overall circuit 48 utilizing liquid based electrolytic circuit elements. The elements of the preferred embodiment 81 and a second inert container with three apertures 54 arc combined. The space between container 51 and container 54 is occupied by a fourth electrolyte 14. A third semipermeable separator 23 is mounted in container 54 between electrolyte 11 and electrolyte 14. Separator 23, electrolyte 11 and electrolyte 14 constitute a third separator system 63. A fourth semipermeable separator 24 is mounted in container 54 between electrolyte 13 and electrolyte 14. Separator 24, electrolyte 13 and electrolyte 14 constitute a fourth separator system 64. A fifth semipermeable separator 25 is mounted in container 54 between electrolyte 12 and electrolyte 14. Separator 25, electrolyte 12 and electrolyte 14 constitute a fifth separator system 65. The conventional common negative ion (not shown) is also present in electrolyte 14.

Operation of Preferred Embodiment

The operation of the preferred embodiment of this invention is analogous to the operation of active solid state semiconductor devices in common use except for its unique charactcristics and thermodynamic properties.

Chemically, the preferred embodiment can be represented by describing the concentration density of each ion occurring in the electrolytes of the system as a function of position in that system. FIG. 2 illustrates a typical concentration gradient 44 in the ion concentration density function for one of the ions present in separator system 61. From an electrical point of view, separator system 61 can be described by the electrical potential created by the separation of the ions of the electrolytes present by the semipermeable nature of separator 21. FIG. 2 also illustrates such a potential gradient 45.

Referring to FIG. 1, FIG. 3 and FIG. 4; the electrical characteristics of separator system 61 can be described by first simple electrical network 86 in FIG. 3. Similarly, the electrical characteristics of separator system 62 can be described by second simple electrical network 87 in FIG. 4. As is well known in the art, the parametric values of each component in network 86 and network 87 may be different depending on the constituents of the electrolytes and separators comprising system 61 and 62. Network 87 is shown as the mirror image of network 86 in order to simplify the interpretation of FIG. 5. The electrolytes of the preferred embodiment arc variants of common sea water. In the predetermined distance between separator 21 and separator 22, only the liquid crystalline form of water is found and the charge transport is by positive charges known as holes.

Referring to FIG. 1 and FIG. 5, the electrical polarity of electrolyte 11 relative to electrolyte 12 is established such that current flows easily through separator 21. Simultaneously, the electrical polarity of electrolyte 13 relative to electrolyte 12 is established such that current flows with difficulty through separator 22. Under these conditions, a change in the potential of electrolyte 11 with respect to electrolyte 12 will cause a similar change in the current flowing through separator 21. Because of "transistor action", a similar change in current will be found to flow through separator 22 even though the potential on separator 22 is such as to discourage such current. FIG. 5 illustrates the above situation using electrical notation in a manner similar to that used in solid state semiconductor devices. In description 49, if a potential is applied to terminal 71 relative to terminal 72 which causes a current to flow easily through diode 101, and if a potential is applied to terminal 73 relative to terminal 74 which inhibits the flow of current through diode 102, a current will appear at terminal 73 by way of the path through generator 47.

FIG. 6 illustrates how the necessary potentials are usually established. Impedance 133 and battery 113 are connected in series to terminals 71 and 72. Similarly, impedance 134 and battery 114 are connected in series to terminals 73 and 74. For proper operation, the polarity of the net potential applied to diode 101 by battery 113 and battery 111 must be such as to allow current to flow easily through diode 101; and the polarity of the net potential applied to diode 102 by battery 114 and battery 112 must be such as to inhibit the flow of current through diode 102. Under these two conditions, the preferred embodiment 81 is described as being in the active mode. By transistor action, the generator 47 will cause a current to flow from terminal 75 to 73 which is approximately equal, numerically, to the current flowing through diode 101 from terminal 71 to terminal 72. Each battery in FIG. 6 typically exhibits a voltage of 50–10 millivolts.

When the impedance 134 has a larger resistive component than the resistive component of diode 101, the change in output voltage across impedance 134 will exceed the change in input voltage across the diode 101 since the current through diode 101 is essentially equal to the current through the impedance 134. This electrical configuration is known as the common base configuration in conventional solid state semiconductor circuitry.

FIG. 7 illustrates how the preferred embodiment 81 can be incorporated into a broader embodiment 83 with characteristics equivalent to the overall circuit 48 of FIG. 6. Electrolyte 14 provides a common electrical potential. Separator system 63 establishes the potential of electrolyte 11 relative to electrolyte 14. Separator system 64 establishes the potential of electrolyte 13 relative to elctrolyte 14. Separator system 65 establishes the potential of electrolyte 12 relative to electrolyte 14. separator systems 63, 64 & 65 are used to establish the flow of current through separator 21 and to inhibit the now of current through separator 22 but do not participate in transistor action. Under these conditions, any change in the current flowing through diode 101, related to separator system 61 of FIG 1, will cause a similar current to flow through generator 47, related to separator system 62 of FIG. 1, by transistor action. Such change in current through diode 101 can be caused by a number of methods as will be described below.

Figure 8:
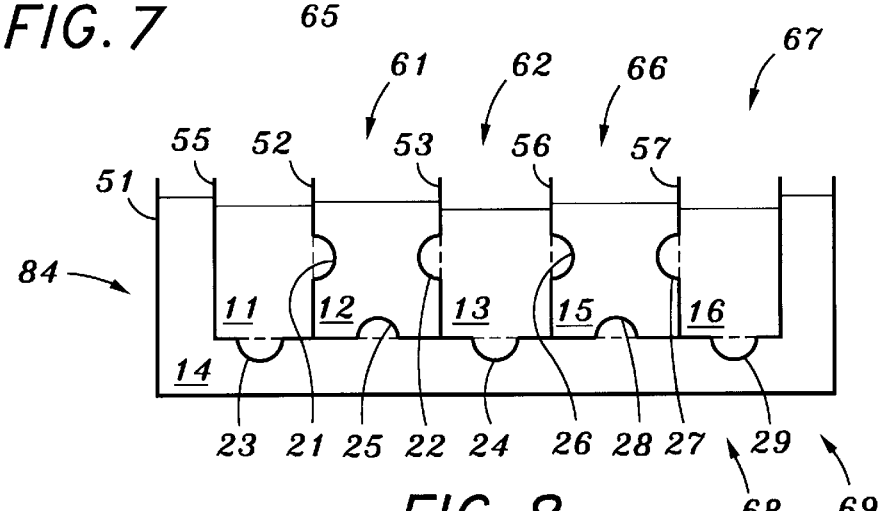
FIG. 8 illustrates a physical embodiment of an overall electrical circuit incorporating two units of the embodiment of FIG. 1 to demonstrate the use of electrolytic interconnecting circuit elements.
Figure 9:
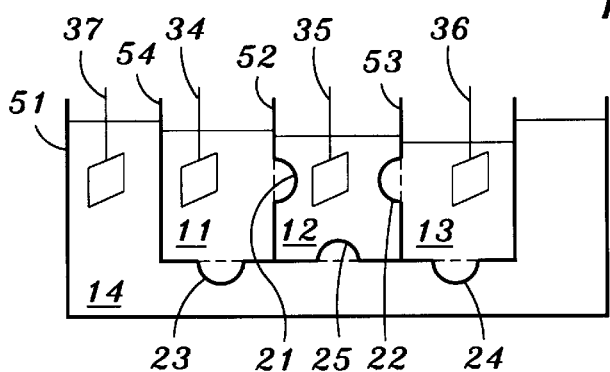
FIG. 9 illustrates a physical embodiment of an overall electrical circuit incorporating the embodiment of FIG. 1 and utilizing metallic interconnecting circuit elements.
Figure 10:
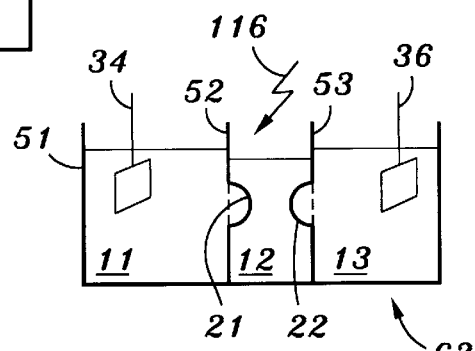
FIG. 10 illustrates a physical embodiment of an overall electrical circuit incorporating the embodiment of FIG. 1 and utilizing metallic interconnecting circuit elements and being stimulated by quantum-mechanical force.

Additional Embodiments are shown in FIGS. 8, 9 & 10

FIG. 8 illustrates a still broader scope physical embodiment 84. The elements of embodiment 83 are rearranged to incorporate a third inert container with five apertures 55 instead of container 54. In addition, a sixth semipermeable separator 26, a third partition with aperture 56, a eighth semipermeable separator 28 and a fifth electrolyte 15 are added. In addition, a seventh semipermeable separator 27, a fourth partition with aperture 57, a ninth semipermeable separator 29 and a sixth electrolyte 16 are added. The surface of separator 26 facing electrolyte 15 is brought to within a predetermined distance, typically 20 Angstrom, of the surface of separator 27 facing electrolyte 15. A separator system 66 consists of separator 26, electrolyte 13 and electrolyte 15. A separator system 67 consists of separator 27, electrolyte 15 and electrolyte 16. A separator system 68 consists of separator 28, electrolyte 14 and electrolyte 15. A separator system 69 consists of separator 29, electrolyte 16 and electrolyte 14.

FIG. 8 is seen to consist of two preferred embodiments sharing electrolyte 13 and separator system 64. Charge appearing in electrolyte 13 due to transistor action involving separator system 61 and separator system 62, will pass through separator system 66 and result in charge appearing in electrolyte 16 due to transistor action related to separator system 66 and separator system 67. Performance equivalent to that of a two stage direct coupled amplifier is obtained.

There are no metallic circuit elements associated with embodiment 84 in FIG. 8. As long as the chemical and electrical character of the electrolytes 11, 12, 13, 14, 15 & 16 and the separators 21, 22, 23, 24, 25, 26, 27, 28 & 29 are maintained, embodiment 84 will operate without significant irreversible power dissipation.

FIG. 9 illustrates embodiment 83 of FIG. 7 with the addition of a first electrode 34, a second electrode 35, a third electrode 36 and a fourth electrode 37. Each electrode is of solid state material and can be connected to other external elements. By proper choice of electrode materials and external circuit components, a wide range of applications can be satisfied. By injecting a charge into electrolyte 12 via electrode 35 and electrode 37 and holding electrolyte 1|at a fixed potential relative to electrolyte 14, a charge equal to M times the injected charge will appear in electrolyte 13 and can be sensed by circuitry associated with electrode 36 and electrode 37. This electrical configuration is known as the common emitter configuration in conventional solid state semiconductor circuitry.

FIG. 10 illustrates preferred embodiment 81 of FIG. 1 with the add ition of electrode 36 and electrode 34. With a potential applied between electrode 36 and electrode 34 that inhibits the flow of current through separator system 62, and a quantum-mechanical force 116 applied to the electrolyte 12 in the region of predetermined distance between separator 21 and separator 22, a mobile charge will be created in electrolyte 12 for each quantum absorbed by electrolyte 12. This charge will cause a M times larger total charge to appear in electrolyte 13 by transistor action. The larger total charge in electrolyte 13 can be sensed by external circuitry attached to electrode 36.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

Conclusion, Ramifications and Scope

Accordingly the reader will see that active liquid-state semiconductor devices based on this invention, whether using man-made or biologically based materials, can be produced that offer a range of functional capabilities even wider than those associated with active solid state semiconductor devices. Furthermore, the invention has the additional advantages in that it can be incorporated into living biological systems easily without the necessity of overcoming the metallic wire to electrolyte interface;

it allows the net electrical voltage applied to a given terminal of the device to be varied through changes in the electrolytes present in the individual solutions;

it can be used as a sensitive sensor of electrolytic changes in a living organism or other electrolytic system;

it can be combined easily with other electrolytic devices, such as liquid crystal displays;

it can be manufactured using man-made and/or natural semipermeable separators;

it can be incorporated into individual sites within a larger electrolytic system.

While my above description contains many specificities, these should not be construed as limitations on the scope of the invention, but rather as an exemplification of one preferred embodiment thereof. Many other variations arc possible. For example;

it is possible to create devices with multiple input structures like first separator system 61 that share the common electrolyte 12 and an intimate physical relationship with the second separator system 62. The resulting configuration produces an output current that is essentially equal to the sum of multiple independent input currents.

What is claimed is:

1. An active liquid-state three terminal semiconductor device comprising;

a first electrolyte, a first semipermeable separator, a second electrolyte, a second semipermeable separator, a third electrolyte, said first electrolyte and said second electrolyte sandwiching said first semipermeable separator, said third electrolyte and said second electrolyte sandwiching said second semipermeable separator, said second semipermeable separator disposed a predetermined distance from said first semipermeable separator sandwiching said second electrolyte, said third electrolyte and said first electrolyte exhibit the same electrical polarity relative to said second electrolyte, and whereby transistor action is obtained upon application of appropriate external circuits between said first electrolyte and said second electrolyte and also between said second electrolyte and said third electrolyte.

2. The device of claim 1, further including;

means of establishing any electrical potential between said first electrolyte and said second electrolyte which encourages the flow of current through said first separator, means of establishing any electrical potential between said third electrolyte and said second electrolyte which discourages the flow of current through said second separator, and whereby transistor action is realized.

3. The device of claim 1, further including;

external means of establishing any potential between said first electrolyte and said third electrolyte, with a quantum-mechanical force urging said second electrolyte to create charge carriers. and whereby transistor action is realized and current flows through said first semipermeable separator and through said second semipermeable separator proportional to said quantum mechanical force.

4. An active liquid-state multiple terminal semiconductor device comprising;

at least a first separator system comprising;

a first electrolyte, a first semipermeable separator,
a second electrolyte,
a second separator system comprising;
   said second electrolyte,
   a second semipermeable separator,
   a third electrolyte,
said first semipermeable separator of at least said first separator system disposed a predetenmined distance from said second semipermeable separator sandwiching said second electrolyte, said third electrolyte and said first electrolyte of at least said first separator system exhibit the same electrical polarity relative to said second electrolyte, and whereby multiple independent occurrences of transistor action is obtained upon application of appropriate external circuits between said first electrolyte of at least said first separator system and said second electrolyte, and between said second electrolyte and said third electrolyte.

* * * * *